(12) United States Patent
Gudmundsson et al.

(10) Patent No.: US 10,613,123 B2
(45) Date of Patent: Apr. 7, 2020

(54) METHOD AND APPARATUS FOR POWER QUALITY AND SYNCHROPHASOR MONITORING ON POWER LINES

(71) Applicant: U.S. Army Research Laboratory ATTN: RDRL-LOC-I, Adelphi, MD (US)

(72) Inventors: Thorkell Gudmundsson, San Jose, CA (US); David M Hull, Adelphi, MD (US); James W. Waite, Los Gatos, CA (US); Ross N Adelman, Bethesda, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 1100 days.

(21) Appl. No.: 14/274,259

(22) Filed: May 9, 2014

(65) Prior Publication Data
US 2014/0343878 A1 Nov. 20, 2014

Related U.S. Application Data

(60) Provisional application No. 61/823,883, filed on May 15, 2013.

(51) Int. Cl.
*G01R 19/25* (2006.01)
*G01R 29/08* (2006.01)
*G01R 25/00* (2006.01)

(52) U.S. Cl.
CPC ..... *G01R 19/2513* (2013.01); *G01R 29/0814* (2013.01); *G01R 25/00* (2013.01); *Y02E 60/728* (2013.01); *Y04S 10/265* (2013.01)

(58) Field of Classification Search
CPC ............................ G01R 21/133; G01R 15/142; G01R 21/1331; G01R 27/16; G01R 19/2513;
(Continued)

(56) References Cited

U.S. PATENT DOCUMENTS 6,714,000 B2 * 3/2004 Staats .................. G01R 15/142
324/107
6,771,058 B2 8/2004 Lapinksi
(Continued)

OTHER PUBLICATIONS

Hull, David, et al. "An interactive 2-D Power-Line Modeling and Simulation Tool", Proceedings of SPIE/DSS, vol. 8382, No. 3, Apr. 2012.

(Continued)

*Primary Examiner* — Regis J Betsch
*Assistant Examiner* — Kaleria Knox
(74) *Attorney, Agent, or Firm* — Eric B. Compton; Lawrence E. Anderson

(57) ABSTRACT

A system and method for estimating the magnitude and phase of magnetic and electrical currents in a power line comprising at least one processor operating to create a model of the power line and derive expected complex magnetic and electric-field values; at least one memory; at least one sensor positioned proximate to the at least one power line for sensing and providing measurements of the magnetic and electric fields of the at least one power line; the at least one processor operating to compute a set of complex magnetic and electric field values based upon the measurements provided by the at least one sensor and to estimate parameters related to the complex voltage and/or current of the at least one power line based upon the measured field values and the set of expected complex electric current and voltage values derived from a model of at least one power line.

27 Claims, 9 Drawing Sheets

(58) Field of Classification Search
CPC .... G01R 29/0814; G01K 1/143; G01C 21/20; H02J 3/24; H02H 3/305; G01D 4/002; Y02E 60/428; Y04S 10/265
USPC ........ 702/60; 324/126, 106, 107, 522; 703/3
See application file for complete search history.

(56) References Cited

U.S. PATENT DOCUMENTS

| | | | |
|---|---|---|---|
| 6,956,364 B2 | 10/2005 | Staats | |
| 7,088,090 B2 | 8/2006 | Staats | |
| 7,356,421 B2 | 4/2008 | Gudmundsson | |
| 7,504,819 B2 * | 3/2009 | Engelhardt | G01K 1/143 324/106 |
| 7,701,196 B2 | 4/2010 | Hull et al. | |
| 7,755,371 B2 * | 7/2010 | Wells | G01R 27/16 324/522 |
| 8,103,466 B2 * | 1/2012 | Taft | G01R 19/2513 702/64 |
| 8,280,652 B2 | 10/2012 | Syracuse et al. | |
| 8,457,912 B1 * | 6/2013 | Wells | H02J 3/24 702/60 |
| 9,947,109 B2 * | 4/2018 | Dow | G01B 11/24 |
| 2001/0040446 A1 * | 11/2001 | Lapinksi | G01R 15/142 324/126 |
| 2009/0284249 A1 * | 11/2009 | Syracuse | G01R 15/142 324/126 |
| 2011/0010118 A1 * | 1/2011 | Gaarder | G01R 21/133 702/60 |
| 2011/0172938 A1 * | 7/2011 | Gu | G01D 4/002 702/62 |
| 2012/0016538 A1 * | 1/2012 | Waite | G01C 21/20 701/3 |
| 2012/0027298 A1 * | 2/2012 | Dow | G01B 11/24 382/173 |
| 2013/0107407 A1 * | 5/2013 | Pan | H02H 3/305 361/87 |

OTHER PUBLICATIONS

Olsen and Wong, "Characteristics of Low Frequency Electric and Magnetic Fields in the Vicinity of Electric Power Lines," IEEE Transactions on Power Delivery, vol. 7, No. 4, pp. 2046•2055, Oct. 1992.

Jackson, Classical Electrodynamics, 3rd Ed., Chap 5, pp. 174-201, Wiley, NY, 1999.

Benmouyal, et al., "Synchronized phasor measurement in protective relays for protection, control, and analysis of electric power systems," 57th Annual Conference for Protective Relay Engineers, Apr. 2004, pp. 419-450.

O'Brien, J. et.al., "Use of Synchrophasor Measurements in Protective Relaying Applications," Power System Relaying Committee, Report of Working Group C-14 of the System Protection Subcommittee, Apr. 2012.

Hull, "Time-Varying Electrostatic Modeling Techniques", Proceedings of the 1997 ARL Sensors and Electron Devices Symposium, pp. 209-212, College Park, MD, Jan. 14-15, 1997.

Olsen, R., "Calculations of ELF Electric and Magnetic Fields in Air," Proceedings of EMF Engineering Review Symposium, Charleston, SC, Apr. 28-39, 1998, ftp://ftp.emf-data.org/pub/emf-data/.../topic-06a-synopsis.pdf.

Von Meter, A, et al., "Micro-synchrophasors: A Promising new Measurement Technology for the AC Grid," i4 energy Seminar, Oct. 19, 2012.

Harrington, R., "Matrix Methods for Field Problems," Proceedings of the IEEE, vol. 55, No. 2, p. 136, Feb. 1967.

* cited by examiner

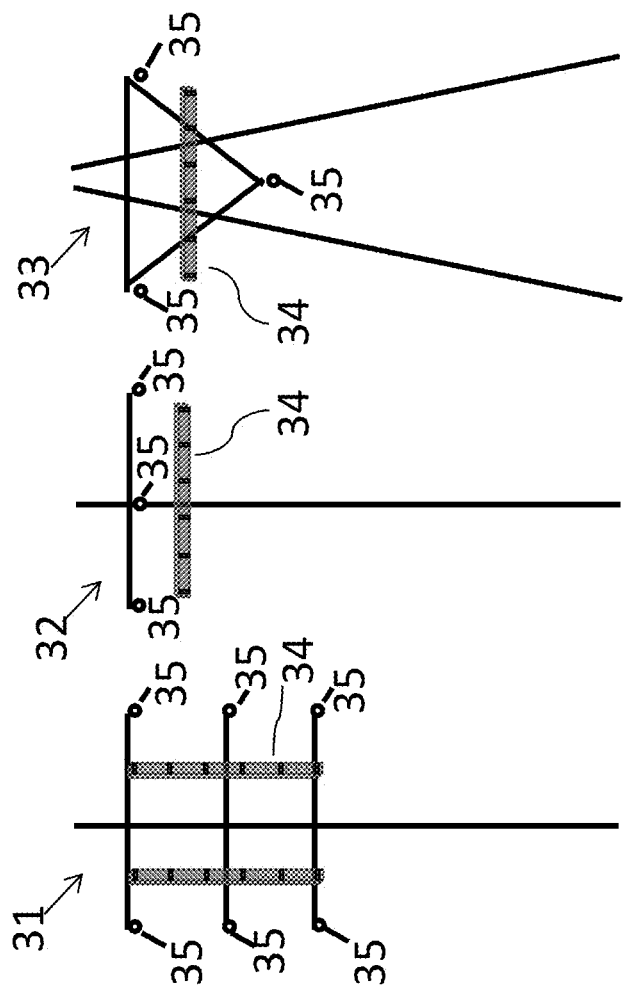

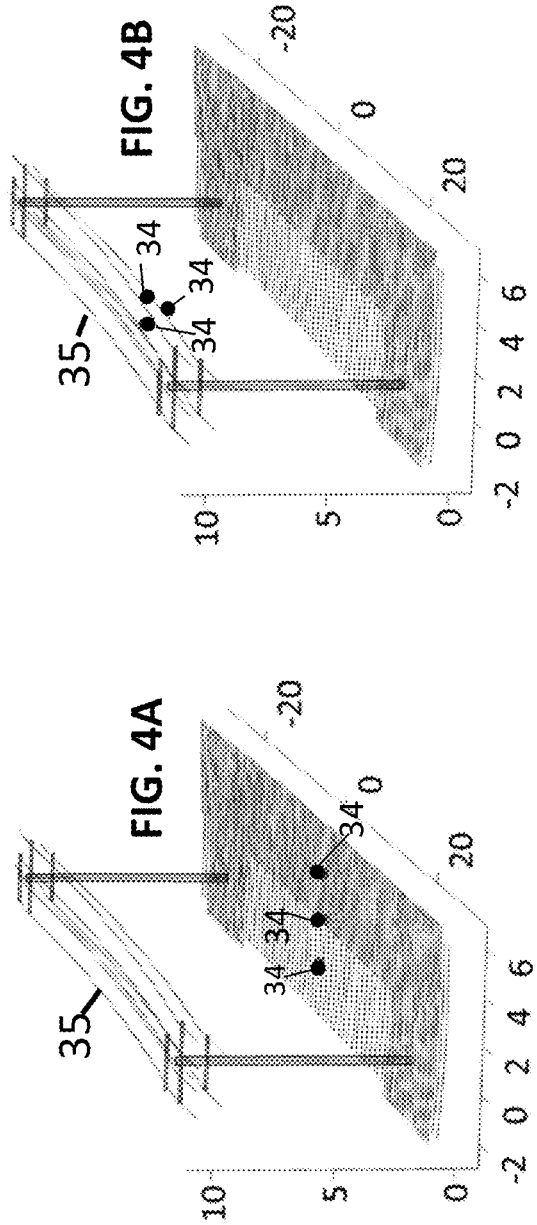
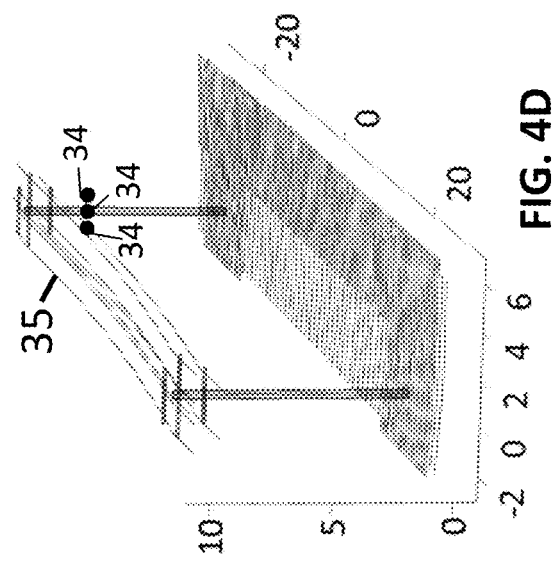
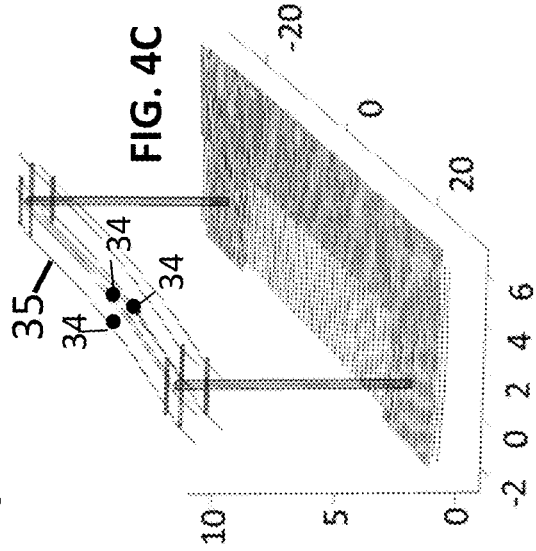
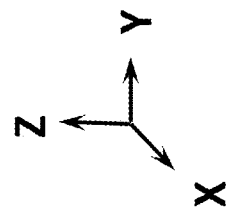

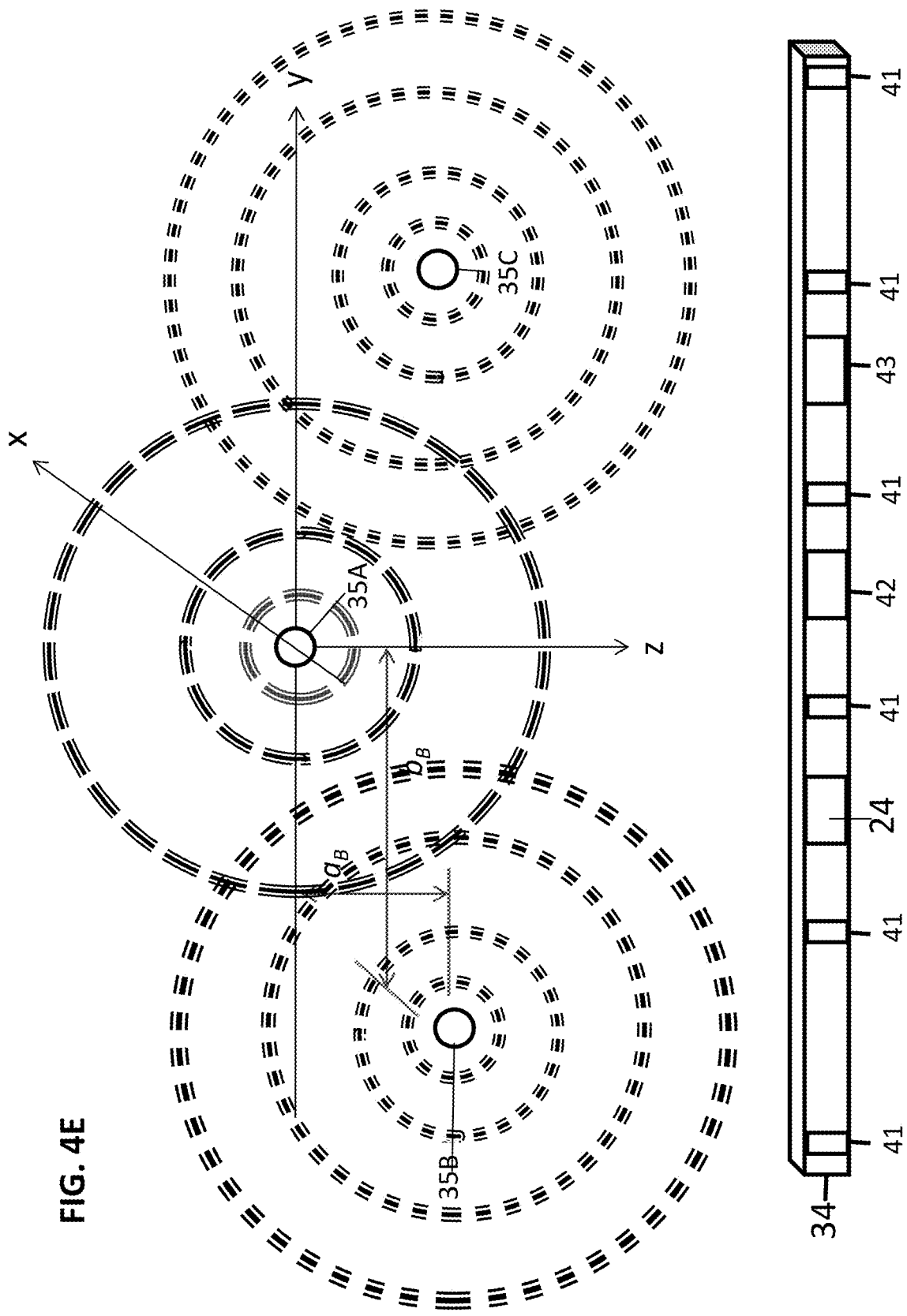

FIG. 7   2-D E/M field model   Measurements are: $E_{n,y}, E_{n,z}, H_{n,y}, H_{n,y}$ $$\rho_i = \frac{1}{2\pi\varepsilon_0} inv(P) * v_i \qquad \text{—70}$$

ρ is the charge and P is the known potential coefficient matrix based on line-line and line-ground separation; (assuming an image model in which the charges reflect around the ground plane)

$$E_{y,n} = \sum_i \rho_i \left( \frac{(y_{n,i} - b_i)}{(z_{n,i} + a_i)^2 + (y_{n,i} - b_i)^2} - \frac{(y_{n,i} - b_i)}{(z_{n,i} - a_i)^2 + (y_{n,i} - b_i)^2} \right) \qquad \text{—71}$$

$$E_{z,n} = \sum_i \rho_i \left[ \frac{(z_{n,i} + a_i)}{(z_{n,i} + a_i)^2 + (y_{n,i} - b_i)^2} - \frac{(z_{n,i} - a_i)}{(z_{n,i} - a_i)^2 + (y_{n,i} - b_i)^2} \right] \qquad \text{—72}$$

$$H_{y,n} = \sum_i \frac{\mu_0 I_i}{2\pi} \left[ \frac{(z_{n,i} - a_i)}{(z_{n,i} - a_i)^2 + (y_{n,i} - b_i)^2} \right] \qquad \text{—73}$$

$$H_{z,n} = \sum_i \frac{\mu_0 I_i}{2\pi} \left[ \frac{(y_{n,i} - b_i)}{(z_{n,i} - a_i)^2 + (y_{n,i} - b_i)^2} \right] \qquad \text{—74}$$

SCHEMATIC OF ELECTRICAL COMPONENTS

METHOD AND APPARATUS FOR POWER QUALITY AND SYNCHROPHASOR MONITORING ON POWER LINES

CROSS-REFERENCE TO RELATED APPLICATIONS

This application claims priority to U.S. Provisional Application No. 61823883 filed May 15, 2013, hereby incorporated by reference as though fully rewritten herein.

STATEMENT OF GOVERNMENT INTEREST

The invention described herein may be manufactured, used, and licensed by or for the United States Government without the payment of royalties. The subject matter of this application is at least partially supported by the U.S. Army Research Laboratory, 2800 Powder Mill Rd., Adelphi, Md. 20783-1197, Research Grant No. ARL CRADA#11-12.

BACKGROUND OF THE INVENTION

At power-line frequencies (typically 50 or 60 Hz), the electric and magnetic fields are quasi-static: that is, the separate (static) terms are much larger than the coupled ("EM") field terms. For example, the magnetic field measured at a sensor location is equal to the superposition of the constituent magnetic fields due to the currents in each line (as reported in Olsen and Wong, "Characteristics of Low Frequency Electric and Magnetic Fields in the Vicinity of Electric Power Lines," IEEE Transactions on Power Delivery, Vol. 7, No. 4, pp. 2046-2055, October, 1992)). These constituent fields are vector fields that change in time (e.g., at 50/60 Hz), with the sources.

Specifically, the line currents that typically exist on electric power lines give rise to quasi-static magnetic fields according to the Biot-Savart Law (as reported in Jackson, *Classical Electrodynamics*, 3rd Ed., Chap 5, Wiley, NY, 1999). Similarly, the AC voltages on electric power lines give rise to quasi-static electric fields (see chapter 1 of *Classical Electrodynamics*). Like the magnetic field, the constituent electric fields are out of phase with each other in time, and so the total electric field is a rotating field. This rotation can be seen, for example, using false-color movies generated by ARL-PLUMS, which is referenced in the publication by David Hull and Ross Adelman entitled "An interactive 2-D Power-Line Modeling and Simulation tool", Proceedings of SPIE/DSS, Vol. 8382, No. 3, April 2012. However, the sources of the quasi-static electric field are the line charges, not the line voltages. Each of these source charges is a linear function of not only the complex-valued line voltages, but also of the self- and mutual capacitances between the energized lines and any grounded objects. Since the capacitance (per unit length) changes with the line sag, proximity to the poles, and other factors, the electric charge density is not even constant along each line, unlike the line currents that are the source of the magnetic field.

Poly-phase (typically, three-phase) power lines are operated with the voltages 120 degrees out of phase with each other. A complex-valued measurement, called a phasor, is commonly used to describe the magnitude and phase of these sinusoidal voltage functions. If the phase angle is referenced to a common time base, such as can be provided by GPS, then the phasor is called a synchrophasor. Synchrophasors are useful for analyzing the dynamic stability of a power system over a wide area, particularly on a transmission grid. Similarly, the magnitude and phase of electric currents can be described as phasors. In general, the angle between the line current and the corresponding line voltage phasors is not zero; this load phasor angle is described in U.S. Pat. No. 7,701,196. Load phasors are useful for analyzing the dynamic loads on a power system, particularly a distribution network, and for adding or subtracting reactive power (volt-amps reactive, or VARs) to the system to reduce $I^2R$ losses or otherwise improve the performance of a power system. Moreover, the angle between the current phasors in a three-phase power system is not always equal to 120 degrees; this can occur, for example, when the three-phase load is not balanced.

Magnetic sensors may be utilized to estimate an unknown wire position (or dynamic wire sag), in addition to estimating rms line currents, using data from an additional magnetic-field sensor (or with three additional sensors for three independent sags). A method for doing this is described in U.S. Pat. No. 8,280,652, issued to Promethean Devices. This patent does not appear to envision the additional complexities involved with electric-field sensing and calibration, and the method used in that patent does not apply when using electric-field sensors.

Magnetic and electric-field sensors may be utilized to estimate the magnitude and direction of net electrical power over a power line. For example, see U.S. Pat. Nos. 6,714,000, 6,771,058, 6,956,364, and 7,088,090 issued to Genscape, Inc. These patents disclose the computation of voltage phasors in situations where the assumptions made with relatively simple 2-D models hold (i.e., away from trees, transmission line structures, and fences).

The present invention relates broadly to the monitoring of power lines and, in particular, to power quality and synchrophasor monitoring on power lines. With the advent of Distributed Generation (DG), electric power grid management increasingly monitors power quality parameters in the grid as reported in G. Benmouyal, et al., "Synchronized phasor measurement in protective relays for protection, control, and analysis of electric power systems," 57th Annual Conference for Protective Relay Engineers, April 2004, pp. 419-450 and O'Brien, J. et. al., "Use of Synchrophasor Measurements in Protective Relaying Applications", Power System Relaying Committee, Report of Working Group C-14 of the System Protection Subcommittee, April 2012. Therefore, there is a need for systems that monitor the electrical power grid.

SUMMARY OF THE INVENTION

A method for measuring the magnitude and phase of the magnetic field within a space under excitation by one or more power cables of the power line with one or more magnetic field sensors; measuring the magnitude and phase of the electric field within the space under excitation by the one or more power cables of the power line with one or more electric field sensors; synchronizing the field measurements to a global time base; modeling a set of expected complex magnetic and electric strengths of the set of power cables based on a model of the one or more power cables; and estimating parameters related to a complex voltage and current of each power cable based on the residual error between the measured set of complex field values and the set of expected field values corresponding to a combined model of the one or more power cables. This may, inter alia, be referred to as a Field Synchrophasor Unit (or FSU) in subsequent text.

A system for estimating the magnitude and phase of at least one selected from the group consisting of electrical voltages and currents in at least one power line comprising;
  at least one processor operating to create a model of the at least one power line and derive a set of expected complex magnetic or electric field values of the at least one power line based upon the model of the at least one power line;
  at least one memory operatively connected to the at least one sensor for storing a set of at least one selected from the group consisting of expected complex magnetic and electric values of the at least one power line based on a model of the at least one power line;
  at least one sensor operatively connected to the at least one processor and adapted to be positioned proximate to the at least one power line for sensing and providing measurements of the magnitude and phase of at least one selected from the group consisting of the magnetic and electric fields of the at least one power line;
  the at least one processor operating to estimate parameters related to the at least one selected from the group consisting of complex voltage and current of the at least one power line based upon the measured set of at least one selected from the group consisting of complex magnetic and electric-field values and the set of at least one selected from the group consisting of expected complex magnetic and electric-field values derived from a model of the at least one power line.

An alternate preferred embodiment comprises a system for estimating the magnitude and phase of electrical currents and voltages in at least one electrical power transmission line in a power grid comprising: (a) at least one processor operating to create a model of the at least one power line and derive a set of expected complex magnetic and electric values of the at least one power line based upon the model of the at least one power line; (b) at least one memory operatively connected to the at least one sensor for storing a set of expected complex magnetic and electric values of the at least one power line based on a model of the at least one power line; (c) at least one sensor operatively connected to the at least one processor and adapted to be positioned proximate to the at least one power line for sensing and providing measurements of the magnitude and phase of the magnetic and electric fields of the at least one power line; (d) a synchronizer operatively connected to the at least one sensor for synchronizing the measurements in time; (e) the at least one processor operating to compute magnetic and electric field values based upon the measurements provided by the at least one sensor; the at least one processor operating to estimate parameters related to the complex voltage and current of the at least one power line based upon the measured set of complex magnetic and electric values and the set of expected complex magnetic and electric values derived from a model of the at least one power line.

These and other embodiments will be described in further detail below with respect to the following figures.

BRIEF DESCRIPTION OF THE DRAWINGS

The foregoing and other objects, features, and advantages of the invention will be apparent from the following more detailed description of the preferred embodiments of the invention, as illustrated in the accompanying drawings, wherein:

FIG. 3A is a schematic illustration depicting a preferred embodiment comprising two field synchrophasor units for a measurement, estimation, and processing system deployed in a frame 34 and mounted near (but not in contact with) three-phase power lines 35.

FIG. 3B is a schematic illustration depicting an alternate preferred embodiment comprising a field synchrophasor unit for a measurement, estimation, and processing system deployed in a frame 34 positioned underneath three-phase power lines 35.

FIG. 3C is a schematic illustration depicting an alternate preferred embodiment comprising a field synchrophasor unit for a measurement, estimation, and processing system deployed in a frame 34 positioned intermediate three-phase power lines 35.

FIG. 4A is an illustration depicting the sensors mounted on the ground under the power lines.

FIG. 4B is an illustration depicting the sensors mounted in the air below the wires.

FIG. 4C is an illustration depicting the sensors mounted a short distance below the wires.

FIG. 4D is an illustration depicting the sensors mounted perpendicular to the pole, and also perpendicular to the direction of the wires. The sensors may be mounted on the power poles (or other supporting structures) in any of a variety of possible orientations (specifically including vertical), or hung from the power lines, or placed on the ground.

FIG. 4E is an illustration depicting a close-up image of a preferred embodiment positioned in the proximity of three power lines 35. The field synchrophasor unit 34 comprises six sensor locations 41, each of which could be either a 1, 2, or 3-axis magnetic field sensor, or a 1, 2, or 3-axis electric field sensor, or any combination of both.

FIG. 7 is a schematic block diagram depicting the mathematical equations for the 2-D E/M field model.

Figure 1:
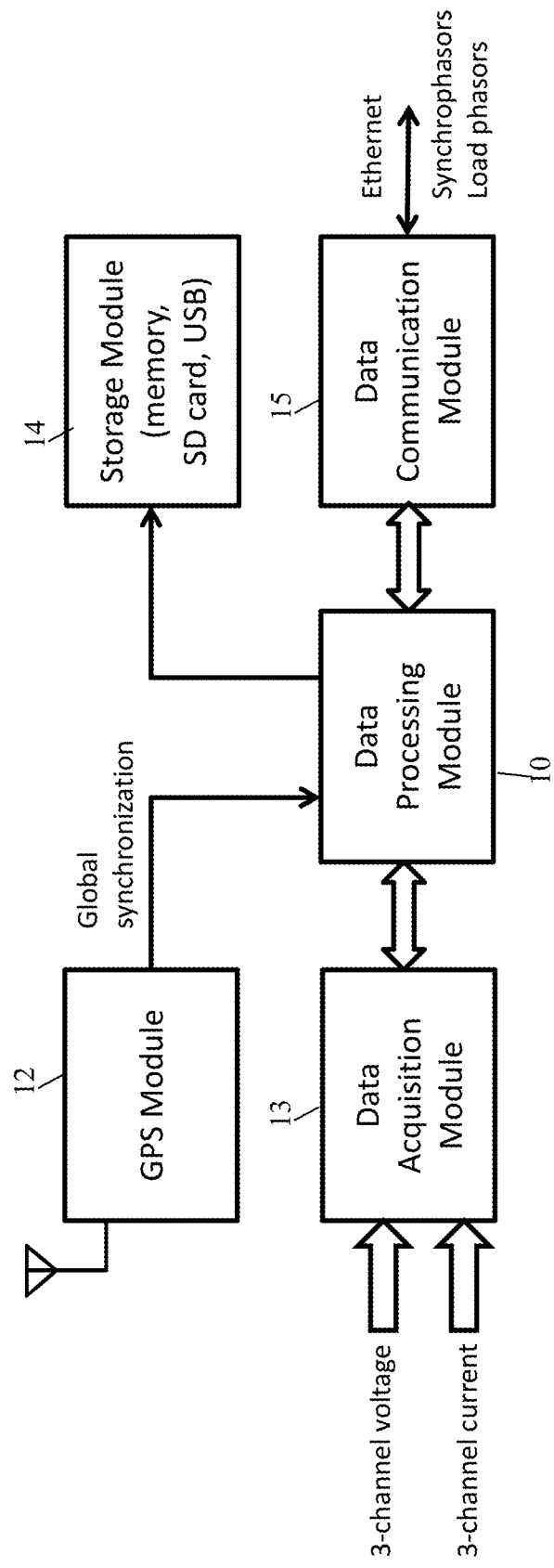
FIG. 1 is a schematic block diagram of a prior art data processing system used to process synchrophasors.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DESCRIPTION OF THE PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as an object, layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. For example, when referring first and second photons in a photon pair, these terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention. Additionally, the drawings are not to scale. Relative sizes of components are for illustrative purposes only and do not reflect the actual sizes that may occur in any actual embodiment of the invention. Like numbers in two or more figures represent the same or similar elements. Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region or object illustrated as a rectangular will, typically, have tapered, rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

The present invention is directed to new methods and devices to monitor the status of electrical power grids through a synchronized network of accurate low-cost sensors. The devices may be referred to as field synchrophasor units herein. The field synchrophasor units may be either mounted without any contact to the power lines or through a simple clamp-on contact and measure electric and magnetic fields in lieu of direct measurements of the three-phase voltage and current magnitude and phase. These measurements can be used to derive other quantities of interest, such as the line voltages and currents, effective and reactive power, power factors, and the direction of power flow. The devices are synchronized to a global time base, allowing synchronous monitoring of the grid, for example in terms of so-called synchrophasors. Communication between the sensors and to a centralized location is facilitated through wired or wireless data links Microsynchrophasor measurements are measurements of synchrophasors on a fine scale, especially in a distribution grid Large scale deployment of these microsynchophasor measurements in power distribution networks is complicated by the need to measure the voltage accurately by using resistive dividers, potential transformers, or capacitor coupled transformers. A preferred embodiment of the present invention can lower capital and installation costs by avoiding this complication, thereby allowing dense, grid-wide deployment and improved capabilities to monitor the grid in real time. Improved measurement density will enhance the ability of a network-based process to more accurately predict events that may otherwise result in grid instability or inefficient power distribution. Additionally, it may be desirable to temporarily install a synchrophasor measurement unit to measure a particular part of a power system during new installations, upgrades, troubleshooting, disaster recovery, etc. In this case, rapid (and lower-cost) installation of field synchrophasor units can permit diagnostic analyses and assessment of actual improvements in the power system. Moreover, these field synchrophasor units can be reused in other locations, thus providing additional time and cost savings.

The electric and magnetic fields measured by each sensor are induced by a superposition of voltage and current contributions from each nearby conductor. In addition, the electric field due to the power lines is distorted by the ground and nearby wounded features, including steel support structures. A collection of such sensors that are influenced by the same voltage and current can be used to unwind this superposition, yielding the line voltage and current on each conductor.

The relationship between the field measurements and the line quantities is primarily determined by the relative geometric positions of the sensors, conductors and other features. This relationship is well understood and can in practice often be captured accurately through a set of linear equations, as follows:

In general, a linear relationship exists between the set of line voltages and the sensed electric fields at a set of field points. This enables the line voltages and the electric field measurements to be related by a matrix equation in much the same way that the line currents are related to the magnetic field measurements. As an example, consider the three-phase power line shown in FIG. 4E. The power lines are labeled 35A, 35B and 35C. The voltages on these lines are referred to as $V_A$, $V_B$, and $V_C$. Assuming three electric-field sensors are placed in the general vicinity of the power lines; referred to as locations 1, 2, and 3, the electric field sensed by these sensors be $E_1$, $E_2$, and $E_3$. The matrix equation relating these quantities can be written as $$\begin{bmatrix} E_1 \\ E_2 \\ E_3 \end{bmatrix} = \begin{bmatrix} K_{11} & K_{12} & K_{13} \\ K_{21} & K_{22} & K_{23} \\ K_{31} & K_{32} & K_{33} \end{bmatrix} \begin{bmatrix} V_A \\ V_B \\ V_C \end{bmatrix}$$

The matrix in this equation, K, which is called the calibration matrix, is entirely a function of the geometry involved, including the positions of the power lines, ground and other environmental boundaries, and the positions and orientations of the electric-field sensors. As a result, the calibration matrix is unique to every situation, and must be recalculated or recalibrated in each case.

The calibration matrix, K, is the product of two real-valued matrices, C and S. The first matrix, C, is a capacitance matrix; this matrix describes the self- and mutual coupling between each of the wires and ground. These values are a function of the wire diameters, heights, and relative positions. This matrix transforms the wire voltages into wire charges (or line charge densities in the case of the 2-D models); these quasi-static electric charges are the sources of the measured electric fields. The ij-th element of the capacitance matrix describes the amount of charge that will be induced on the ith wire by a unit of voltage on the jth wire and its image(s). These terms are defined in equations (5) and (6) of Hull and Adelman, "An interactive 2-D power-line modeling and simulation tool", Proceedings of SPIE, Vol. 8382, No. 3, May 2012. The second matrix, S, is the source-to-field matrix; it transforms the wire charges into the measured fields using Coulomb's Law and the Principle of Superposition. The ij-th element of the source-to-field matrix describes the electric field that will exist at the ith sensor location in response to a unit of charge on the jth wire and its image(s). These field equations are shown in 71 and 72 for the electric field, and 73 and 74 for the magnetic field for the case of a simple 2-D model.

Once K is computed, it is inverted, so that the set of measured fields can be transformed into the unknown line voltages. Even though the matrix K is real, the E and V vectors are complex-valued phasors; that is, they have a magnitude and a phase (in time). Generally, the line voltages for a three-phase power line have the same magnitude, and are delayed by 120 degrees relative to each other. However, the field measurements have no similar constraints, since the phase angle varies with the sensor location. Therefore, one check on the accuracy of this method is to verify that the computed line voltages are indeed sensible (that is, equal in magnitude and separated by 120 degrees of phase in time).

The calibration steps are: (a) determine the source capacitance matrix C; (b) determine the source-sensor matrix S; (c) multiply them together to get the calibration matrix K=CS; and finally, (d) invert the calibration matrix $K^{-1}$. This final matrix $K^{-1}$ is the one that is used to transform a set of measured field values to unknown line voltages (and relative phases).

$$V = K^{-1} E$$

Once the calibration matrix is known, the following procedure can be used to estimate the voltages on the lines from the electric field measurements. The electric field measurements are fed through a bandpass filter to obtain the field phasors corresponding to the operating frequency of the power lines (or a harmonic). The field phasor of $E_1$ is used as the phase reference, so all of the field phasors are rotated so that the phase angle of $E_1$ is zero. The matrix equation above is inverted to obtain $V_A$, $V_B$, and $V_C$. The phase reference is still $E_1$, so to use $V_A$ as the phase reference for the voltage phasors, all of the voltage phasors are rotated so that $V_A$ has a phase angle of zero.

More electric field sensors can be used to improve the performance of the estimation procedure. This will result in an expanded matrix equation. The calibration matrix, K, will be an N×3 matrix, where N is the number of sensors. During the estimation process, instead of inverting the calibration matrix, a least-squares solution is used. This is because, with more equations than unknowns, the set of linear equations will be over-determined.

Examples of the coefficients of the calibration matrix, computed using two different modeling and simulation tools are presented herein. One is a simplified 2-D power-line model shown in FIG. 7. The other is a 3-D model created and calculated using a custom Army Research Laboratory method-of-moments software, described further in Hull, "Time-Varying Electrostatic Modeling Techniques", Proceedings of the 1997 ARL Sensors and Electron Devices Symposium, pp. 209-212, College Park, Md., 14-15 Jan. 1997, incorporated by reference herein as though fully rewritten herein.

The following four examples show how changing the position of the sensors results in significant changes to the calibration matrix. In each case, the electric-field sensors are used to detect the vertical (z) component of the electric field.

FIG. 4A describes a set of sensors laid out on the ground, perpendicular to the wires, and approximately mid-span. For the 2-D model with respect to FIG. 4A. in addition to K being shown, the capacitance matrix, C, is also shown, which relates the voltages on lines A, B, and C to the linear charge densities on all seven lines in the model. Because the capacitance matrix is dependent only on the geometry of the power lines, and not the sensors, this matrix is the same for the 2-D model in all four cases.

The calibration matrix using the 2-D model is as follows:

$$K = \text{(units are 1/m)}$$

$$\begin{matrix} -0.0093 & -0.0064 & -0.0138 \\ -0.0074 & -0.0058 & -0.0113 \\ -0.0057 & -0.0049 & -0.0085 \end{matrix}$$

$$C = \text{(units are in pF/m)}$$

$$\begin{matrix} 8.1381 & -1.4010 & -1.5935 \\ -1.4017 & 9.2088 & -1.2501 \\ -1.5888 & -1.2447 & 8.3025 \\ -0.5617 & -1.1677 & -0.6501 \\ -0.4309 & -0.5608 & -0.4587 \\ -0.4604 & -0.6497 & -0.8236 \\ -0.8114 & -2.3564 & -0.7281 \end{matrix}$$

Note that the non-diagonal elements of the capacitance matrix, C, are negative. This is because positive voltage on one wire induces a negative charge on the other wires. Note also that the elements of the K matrix have magnitude on the order of 0.01; this implies that if the lines are energized to voltages on the order of 10 kV, then the measured fields will be on the order of 100 V/m.

The calibration matrix using the 3-D model is as follows:

$$\begin{matrix} -0.0096 & -0.0066 & -0.0142 \\ -0.0066 & -0.0054 & -0.0102 \\ -0.0059 & -0.0050 & -0.0087 \end{matrix}$$

Note that the difference in the calibration coefficients between the 2-D and 3-D models is about 2%. The differences exist because, in the 2-D model, the wires have no sag, the ground is perfectly flat, and the poles do not exist.

FIG. 4B illustrates a set of sensors hanging from the wires, approximately mid-span. The calibration matrix using the 2-D model is as follows:

$$\begin{matrix} -0.0360 & -0.0138 & -0.0857 \\ -0.0083 & -0.0249 & -0.0791 \\ -0.0170 & -0.0131 & -0.0504 \end{matrix}$$

The calibration matrix using the 3-D model is as follows:

$$\begin{matrix} -0.0369 & -0.0143 & -0.0842 \\ -0.0088 & -0.0255 & -0.0797 \\ -0.0174 & -0.0135 & -0.0503 \end{matrix}$$

Note that the elements of the K matrix are about five times as large as for the previous case (FIG. 4A); this implies that the measured fields will be significantly larger. Note also that the coefficients do not scale uniformly; this will result in different phase angles for the measured fields at the two sets of sensor locations. Finally, note that the coefficients in the third column are larger than the coefficients in the other two columns; this is because wire C is closest to the sensors.

FIG. 4C illustrates a set of sensors hanging directly underneath the wires. In this case, the calibration coefficients are larger still, and the matrix is closer to being diagonal than in either of the previous cases.

The calibration matrix using the 2-D model is as follows:

$$\begin{matrix} -0.7518 & 0.0879 & 0.2640 \\ 0.0946 & -0.7981 & 0.2455 \\ 0.0717 & 0.0457 & -0.7043 \end{matrix}$$

The calibration matrix using the 3-D model is as follows:

$$\begin{matrix} -0.8583 & 0.1070 & 0.2750 \\ 0.1130 & -0.9178 & 0.2557 \\ 0.0796 & 0.0531 & -0.7655 \end{matrix}$$

FIG. 4D illustrates a set of sensors hanging on a pole. In this case, the coefficients for the 2-D and 3-D models differ significantly. This is because the absence of the pole in the 2-D model does not account for the significant distortion of the electric field in the vicinity of the pole.

The calibration matrix using the 2-D model is as follows:

$$\begin{matrix} -0.0141 & -0.0164 & -0.0666 \\ -0.0063 & -0.0161 & -0.0357 \\ -0.0007 & -0.0097 & -0.0097 \end{matrix}$$

The calibration matrix using the 3-D model is as follows:

$$\begin{matrix} -0.8583 & 0.1070 & 0.2750 \\ 0.1130 & -0.9178 & 0.2557 \\ 0.0796 & 0.0531 & -0.7655 \end{matrix}$$

In this case, the (grounded) power poles distort the electric fields in the vicinity of the poles. This distortion is reflected in the 3-D model, but is not included in the 2-D model.

The four cases depicted in FIGS. 4A to 4D above are representative examples of possible sensor emplacement scenarios for one distribution line. Many other examples are possible. As one example, if the line voltages are known to be identical in magnitude, and if the relative phases are also known, then only one complex phasor is unknown, and can be determined with measurements from a single sensor (the calibration coefficient will be complex, because it will be the sum of three calibration coefficients that are out of phase with each other). As a second example, six sensors (or three 2-D sensors) can be used to solve for six unknown line voltages if two 3-phase circuits are in the vicinity of the sensors (if the relative phase of the lines in the two circuits are known, then only three sensors are needed. As a third example, additional sensors may be used, an over-determined matrix computed, and Minimum-Mean-Square-Error (MMSE) estimation techniques used to estimate the line voltages.

In a similar manner, a calibration matrix L can be determined that will transform a set of line currents into a set of magnetic-field measurements at a set of sensor locations: B=PI. In this case, the calibration matrix P is much simpler to define, because the coefficients can be determined directly from the Biot-Savart Law and the geometry of the model. Additional terms in the coefficient equations may be needed if the model includes steel structures that may distort the magnetic field, highly-conducting structures that can generate eddy currents (and secondary magnetic fields), etc.

In practice, several "standard" calibration matrices can be pre-computed for typical installations, and the one closest to the actual scenario can be chosen when the sensor is used. This initial matrix can be iteratively refined as described below.

Additionally, the calibration matrix can be broken into two parts: a "free-space" matrix and a "sensor/mounting" matrix. The "free-space" matrix could use the 2-D model, for example, that ignores wire sag, pole distortion effects, etc. The "sensor/mounting" matrix would account for local distortions of the field due to the FSU itself and/or the proximity to the pole. This method permits more combinations of scenarios, but will result in more errors because the two effects are treated separately.

In a normal three-phase power system, the magnitudes of the line voltages should be known and nearly equal to each other, and the phase of the line voltages should be nearly 120 degrees out of phase with each other. If the measured set of electric fields, times the inverse of the calibration matrix does not result in a sensible set of line voltages, then this indicates a problem with the calibration matrix, or with the model, or with the measurements themselves. If the model and the measurements are not suspect, then the calibration matrix can be iteratively refined until the error in the computed voltage magnitudes match the known voltages.

In other situations more complex non-linear equations can be used, or alternatively, an in-situ calibration process can be performed at installation time to capture the relationship. For example, if the power line is de-energized and then re-energized, or if known voltage steps from transformer tap-changing operations are available to the FSU, then the voltage calibration matrix can be iteratively refined to estimate these steps with minimum error. This process can be repeated using many tap changes during the day to improve the calibration over time. Similarly, the phase relationship between the different line quantities can also be captured when the sensor measurements are time-synchronized to a common reference.

Shown in FIG. 1 is a prior art data processing system which measures the electrical waves on an electricity grid, using a common time source for synchronization, also referred to as using synchrophasors. Prior art phasor measurement units rely on the direct measurement of voltage and current on power lines. This necessitates special installation equipment, personnel, and expensive sensors that can withstand the high voltage and currents. These systems are in place for transmission lines, but the economics of existing phasor measurement units for high-voltage systems are incompatible with use in the distribution power network, as is necessary for enhanced smart grid monitoring. Shown in FIG. 1 is a data processing module 10 operatively connected to a unit for global synchronization such as, for example, a global positioning system module 12. Data is acquired via a data acquisition module 13. Data is outputted to storage module 14 which may be a hard drive or SD card. Data is outputted from the data processing module by utilization of a data communications module 15.

Figure 2:
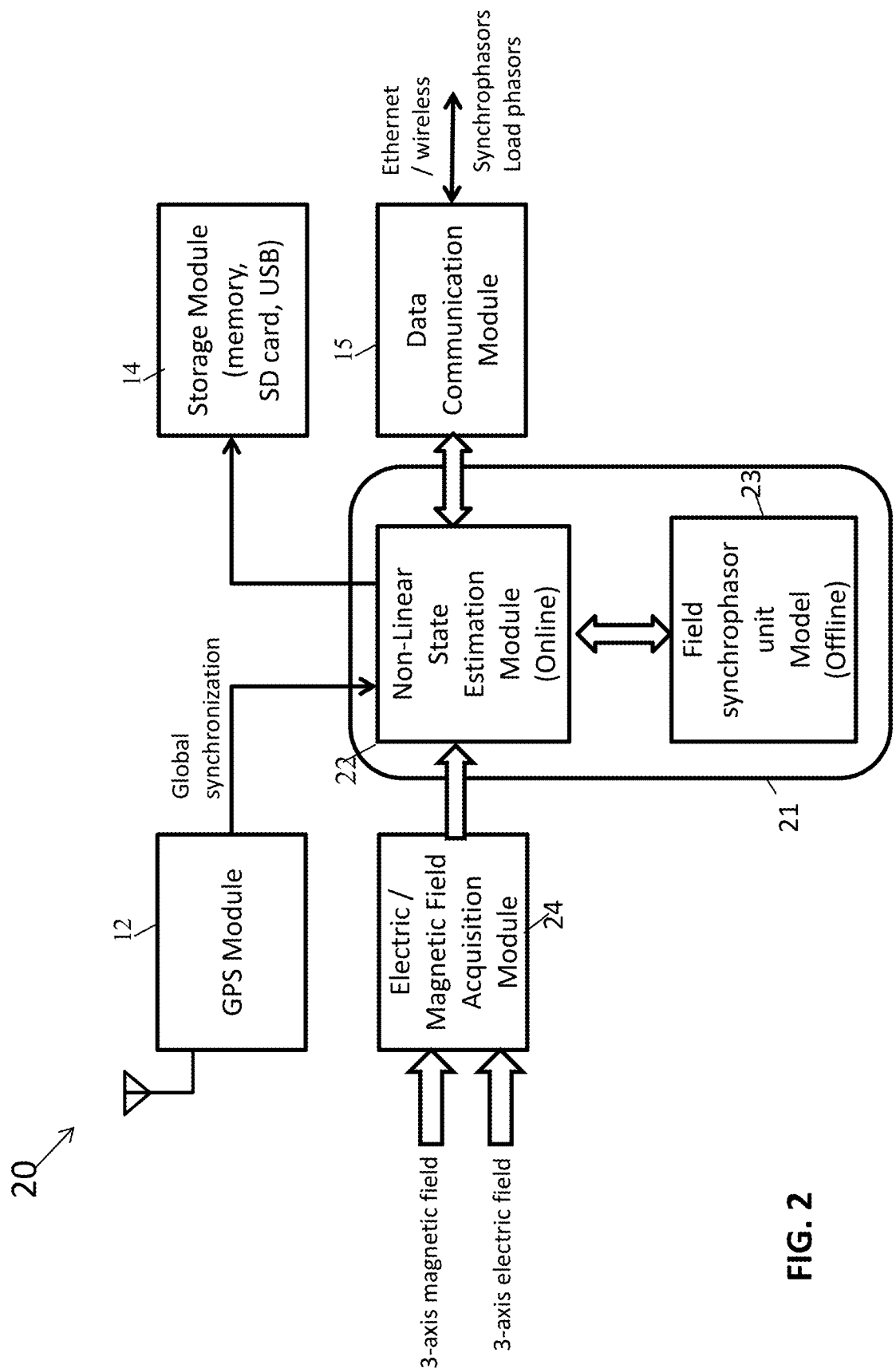
FIG. 2 is a schematic block diagram of a preferred embodiment of the present invention.

Illustrated in FIG. 2 is a preferred embodiment 20 of the present invention comprising a field synchrophasor processor 21 which may have as components a non-linear state estimation module or processor 22 (which may be generally maintained on-line) coupled with a field synchrophasor unit, module or processor 23, which comprises an offline modeling process, as described above, which results in a target model for the measurements obtained from the electric/magnetic field acquisition module or processor 24. The state estimation processor or module 22 employs non-linear estimation (optimization via Levenberg-Marquardt or iterative Kalman filtering) to converge the system state so that the measured electric and magnetic fields agree with the modeled fields. Both the state estimation processor or module 22 and field synchrophasor unit or processor 23 may be implemented in embedded firmware on the field synchrophasor unit application processor 22. Data communications module 15 relays the output of the field synchrophasor unit application processor 22 to a distribution grid monitoring center, which can result in enhanced performance of distribution generation systems.

Phasor Bar

One field synchrophasor unit configuration is a rigid structure such as a linear bar incorporating a number of distinct 2-D or 3-D E-field and H-field sensors, as is illustrated in FIGS. 3A-3C. The number of E-field and H-field sensors is typically each equal to the number of conductors at the installation point. Supplemental sensors may also be included, such as a stereoscopic camera system or laser rangefinder to automatically determine the position of the sensor structure relative to the power lines, and a humidity sensor to remove any effects of humidity changes on the measurements.

As illustrated in FIGS. 3A-3C, the sensor structure is mounted on a pole near the power lines and has no direct contact with the lines. This simplifies the installation of the sensors, as well as allowing a single common processing unit to perform all necessary computations to derive the line quantities. The close proximity of the sensors to the pole makes the relationship between the measurements and line quantities more complex than otherwise, but this is corrected though more complex 3-D models or in-situ calibration, as described above.

Referring now to FIGS. 3A-C, shown are three configurations of three-phase power line supports. In a first embodiment, shown in FIG. 3A. the field synchrophasor unit measurement, estimation, and processing system is deployed in a frame 34 and mounted near (but not in contact with) three-phase power lines 35. Subassemblies 31 (double vertical), 32 (single circuit), 33 (single delta) show various deployment options on distribution network power lines. In some configurations (like the double circuit case which has 6 conductors 35, or even 7 including a neutral conductor), or when there is a preponderance of field distortion, two or more field synchrophasor units 34 can work in tandem (or collaboration), as shown in subassembly 31.

Referring now to the preferred embodiment shown in FIGS. 4A-E, three power lines 35 are monitored by a field synchrophasor unit 34 with three to six sensor locations 41, each of which could be either a 1, 2, or 3-axis magnetic field sensor, or a 1, 2, or 3-axis electric field sensor, or any combination of both. As depicted in FIG. 4E. the geometrical arrangement of the sensors 41 with respect to the power lines (phase A, 35A; phase B, 35B; phase C, 35C) is arbitrary, and shown here for clarity in a simple linear array.

In each of these examples, the electric-field sensors are used to estimate the line voltages, and the magnetic-field sensors are used to estimate the line currents. If both electric- and magnetic-field sensors are used, then the phase angles between the synchrophasors for the currents and the voltages can be determined. This is useful, for example, for determining if power-factor correction is needed at a particular location in the grid (for example, at the service connection point for a large industrial customer), or at a particular time (for example, at an apartment complex with many air conditioners that may be turning on nearly simultaneously at the end of a workday). These relative load phasors are similarly useful for estimating microgrid stability.

The field synchrophasor unit 34 of FIG. 4E also includes an electric and magnetic field data acquisition unit 24, an application processor 42, and network interface 43. Using independent means (visual, laser, ultrasonic, tilt/roll sensor, etc.), application processor 42 may optionally measure the position and orientation of the field synchrophasor unit 34 with respect to the power lines 35A, 35B, and 35C.

Figure 5:
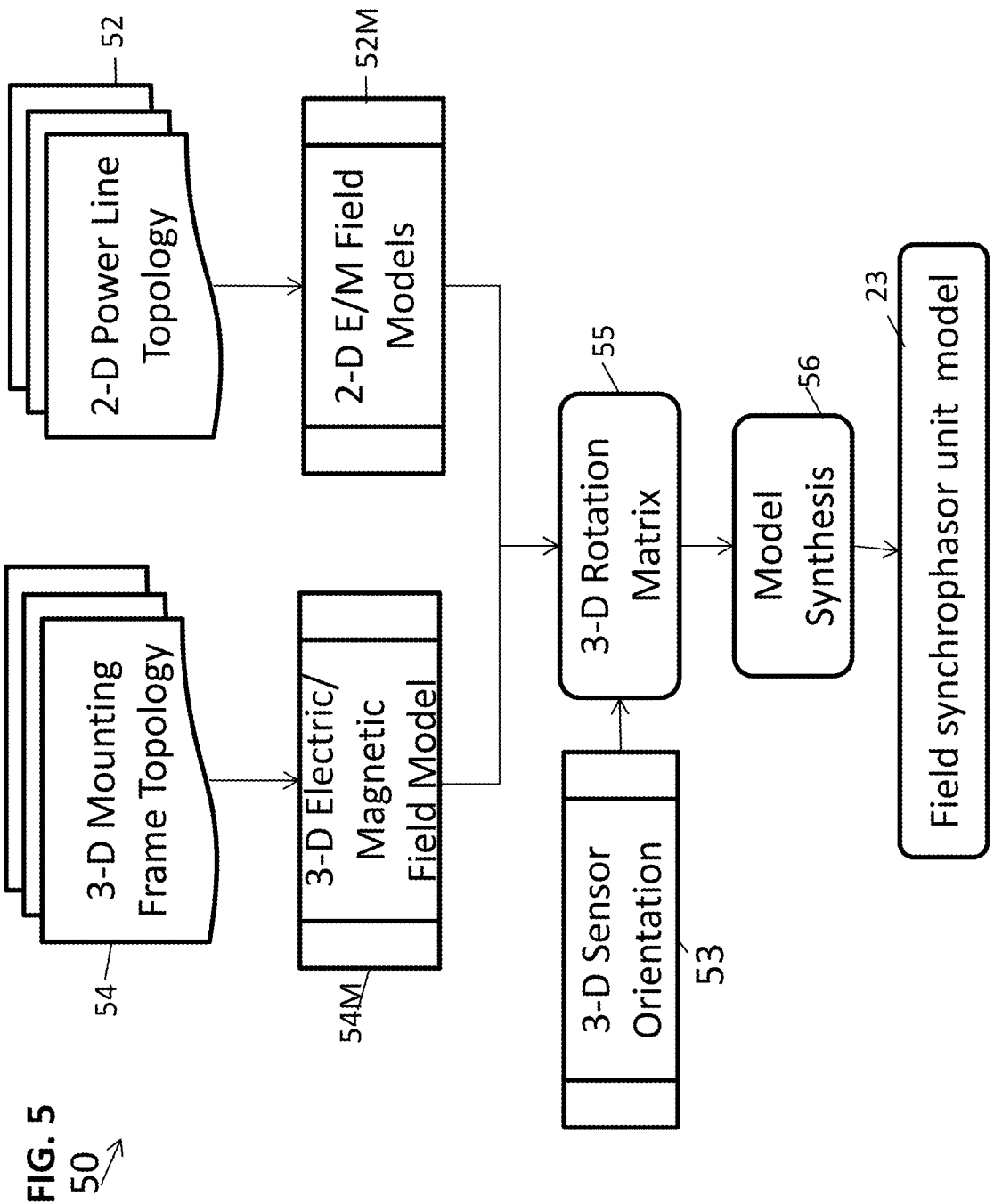
FIG. 5 is a schematic block diagram depicting the field synchrophasor unit Offline Modeling Method.

FIG. 5 is an illustration showing the field synchrophasor unit Offline Modeling Method. Shown in FIG. 5 are the inputs into the field synchrophasor unit model 23 which may be in the form of a computer or processor which models the inputted information including the 2-dimensional power line topology 52 which is used to formulate 2-dimensional electric/magnetic field models 52M, -dimensional sensor orientation data 53, 3-dimensional mounting frame topography 54 which is used to formulate 3-dimensional field models 54M. As shown in FIG. 5, the models 52M and 54M and the 3-D sensor orientation are inputted into a 3-dimensional rotation matrix 55 which is inputted into a model synthesis 56, which is inputted into the field synchrophasor unit model 23, referenced above in FIG. 2.

Figure 6:
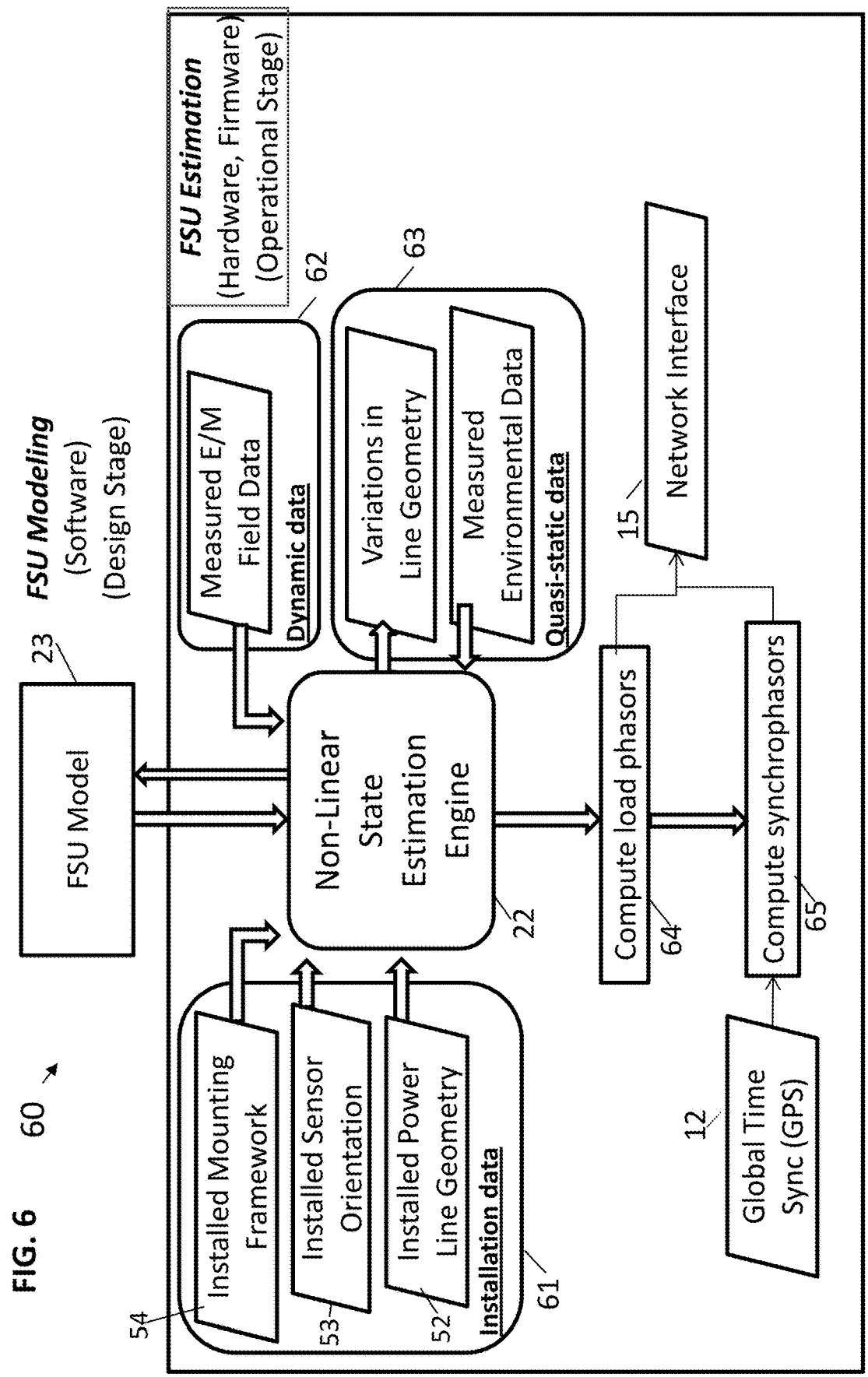
FIG. 6 is a schematic block diagram depicting the online computer implemented estimation method 60 implemented by the field synchrophasor unit 23 in conjunction with the non-linear state estimation engine or processor 22.

FIG. 6 illustrates the online computer implemented estimation method 60 implemented by the field synchrophasor unit model 23 in conjunction with the non-linear state estimation engine or processor 22. It uses the output of the offline field synchrophasor modeling process 50-. The field synchrophasor model 23 (performed in computer software using a computer or processor) describes the expected fields generated for a certain state of the system. Together with measurements 61 (installation data) made at installation time, the field synchrophasor unit combines dynamic measurements of the fields (electric and magnetic) with the field synchrophasor unit model 51 and installation data 61 to predict the state of the line voltage and current magnitudes and phases. Installation data 61 comprises installed power geometry or 2-D power line topology 52, installed (3-D) sensor orientation 53, installed mounting framework or 3-D mounting frame topology 54, which are also shown and described with respect to FIG. 5. The installation data 61 is inputted to a non-linear state estimation module, engine or processor 22. Also inputted into non-linear state estimation module, engine or processor 22 are dynamic measured electric/magnetic field data 62, quasi-static data 63 comprising variations in line geometry and measured environmental data. The field measurements 62 be inputted into the state estimation engine 22, but can also be used to update the model 23. This is useful if the model is only "close" to the actual field emplacement, as described above. The output of the non-linear state estimation engine or processor 22 may then be an input for the computation of load phasors depicted as box 64 in FIG. 6. The computation in box 64 is inputted into the network interface or data communication module 15 (also referenced in FIG. 2). The computed load phasors are inputted into box 65 in which the synchrophasors may be computed. Also inputted into box 65 is the global positioning synch data or GPS data (also referenced in FIG. 2). The output of the synchrophasor computation 65 may be inputted into the network interface 15.

Events on the electrical grid such as transformer tap-changing operations and/or power-factor capacitor switching operations, that show up as perturbations in the field measurements can sometimes be used as model training events, as described above. This can result in an update from the non-linear state estimation engine or processor 22 to the field synchrophasor modeling process 23, so that the model is adapted according to observed operational conditions.

FIG. 7 is an illustration of the mathematical equations used with a 2-D model of the power lines in the on-line estimation method utilizing the field synchrophasor unit of the present invention. Subscript i refers to the ith cable in the power line. Subscript n refers to the nth 3-axis E-field or H-field sensor. Sensor x direction is not shown, but is normally included in the method to pick up non 2-D aspects of the E/H fields, and to fit 3-D models of stationary mounting configurations. The variable $I_i$ is the complex current on line i. The variable $v_i$ is the complex voltage on line i. Quasi-static parameters are: $y_i$, $z_i$. The state parameters are: $I_i$, (current), $v_i$ (voltage). The variable $\rho$ is computed in Box 70 as:

$$\rho_i = \frac{1}{2\pi\varepsilon_0} inv(P)^* v_i$$

The measurements that may be taken are $E_{y,n}$, (computed in Box 71):

$$E_{y,n} = \sum_i \left[ \rho_i \frac{(y_{n,i} - b_i)^2}{(z_{n,i} + a_i)^2 + (y_{n,i} - b_i)^2} - \rho_i \frac{(y_{n,i} - b_i)^2}{(z_{n,i} - a_i)^2 + (y_{n,i} - b_i)^2} \right]$$

$E_{z,n}$ (computed in Box 72)

$$E_{z,n} = \sum_i \left[ \rho_i \frac{(z_{n,i} + a_i)^2}{(z_{n,i} + a_i)^2 + (y_{n,i} - b_i)^2} - \rho_i \frac{(z_{n,i} - a_i)^2}{(z_{n,i} - a_i)^2 + (y_{n,i} - b_i)^2} \right]$$

$H_{y,n}$ (computed in Box 73)

$$H_{y,n} = \sum_i \frac{\mu_0 I_i}{2\pi} \left[ \frac{(z_{n,i} - a_i)}{(z_{n,i} - a_i)^2 + (y_{n,i} - b_i)^2} \right]$$

and $H_{n,y}$, and (computed in Box 74)

$$H_{z,n} = \sum_i \frac{\mu_0 I_i}{2\pi} \left[ \frac{(y_{n,i} - b_i)}{(z_{n,i} - a_i)^2 + (y_{n,i} - b_i)^2} \right]$$

FIG. 7 summarizes the 2-D (Olsen and Wong) models used to estimate the electric and magnetic fields from the source line charges and line currents, respectively.

With a sufficient number of sensors and a sufficiently representative model the line quantities V and I can be derived from the field measurements through various methods. One example is using nonlinear optimization, as reported in R. Fletcher, "Practical Methods of Optimization," Wiley, 1987 to solve the multi-dimensional nonlinear equation; another is using an iterative method such as a Kalman filter, as described in Grewal and Andrews, "Kalman Filtering", 2nd edition, Wiley, 2001, to track the line quantities over time.

If the measurement system is over-determined, an estimate of the confidence of the derived quantities may often be maintained along with the estimates themselves and used to detect anomalies.

III. Sensors and Sensor Configurations

Some embodiments of field synchrophasor unit devices according to the present invention are based on accurately sensing 2 or 3-dimensional magnetic and electric fields. A variety of options exists for those, but light-weight H-field sensors previously developed by Optimal Ranging, Inc., and E-field sensors developed by the U.S. Army Research Laboratory are both good choices and provide the necessary performance, as reported in Gudmundsson, T., and Waite, J., et al, "Precise Location of Buried Metallic Pipes and Cables In the Presence of Signal Distortion", U.S. Pat. No. 7,356,421, 2008, and Hull, D., et al, "Method for Detecting and Classifying Loads on AC Lines", U.S. Pat. No. 7,701,196, 2010, hereby incorporated by reference as though fully rewritten herein. The H-field sensors can, for example, be magnetic coil sensors.

Field synchrophasor unit configurations according to some embodiments of the present invention include the following: A rigid structure incorporating a number of E-field and H-field sensors for mounting on a pole; a smaller multi-sensor device for mounting mid-span on a single conductor; and a cluster of disjoint devices containing one E-field and one H-field sensor for mounting on each conductor.

The sensors in each configuration are synchronized with a common phase reference such as GPS. Each device or device cluster also communicates through a wired or wireless data link to a central location, where the synchronized measurements for an entire network or a network segment are aggregated. The devices can be configured to either send data continuously or when polled, or to monitor for particular events or indicators locally and send warnings to the central controller.

In the alternative, a number of E-field and H-field sensors may be physically attached to a single conductor. Each device typically includes three 2-D E-field and three 2-D H-field sensors may be in the form of a wye configuration and two or more such devices can cooperate on a multi-phase circuit. The clamp-on phasor wye device operates in a similar manner to the sensor structure previously described, but can be mounted away from the poles and therefore provides a simpler relationship between the measurements and the line quantities. The field sensors are positioned a short distance away from the line to minimize localization effects. This device can also include a pitch sensor to account for changes in orientation relative to the lines.

As a further alternative, small devices, each clamped onto different conductor at a particular monitoring location, may be utilized. The sensors may form a cooperative sensor cluster, communicating with each other through a local wireless network. One device acts as a cluster master, handling device coordination and communication with the greater network of sensors. This configuration allows the sensors to be easily installed away from the poles or any other such features, simplifying the relationship to the line quantities. In addition, this allows the line current to be measured directly through a current clamp.

Each device typically includes one 2-D H-field and one 2-D E-field sensor, along with the current clamp and a pitch sensor. The field sensors are positioned a short distance away from the line to minimize localization effects. Each device cooperates with the others in its network to facilitate synchronization and co-processing of the individual measurements.

The measurements may be sufficient to unwind the superposition of contributions at each sensor, as well as correcting for any variations in the relative position or orientation of the sensors and the conductors due to wind, sag or other effects.

Figure 8:
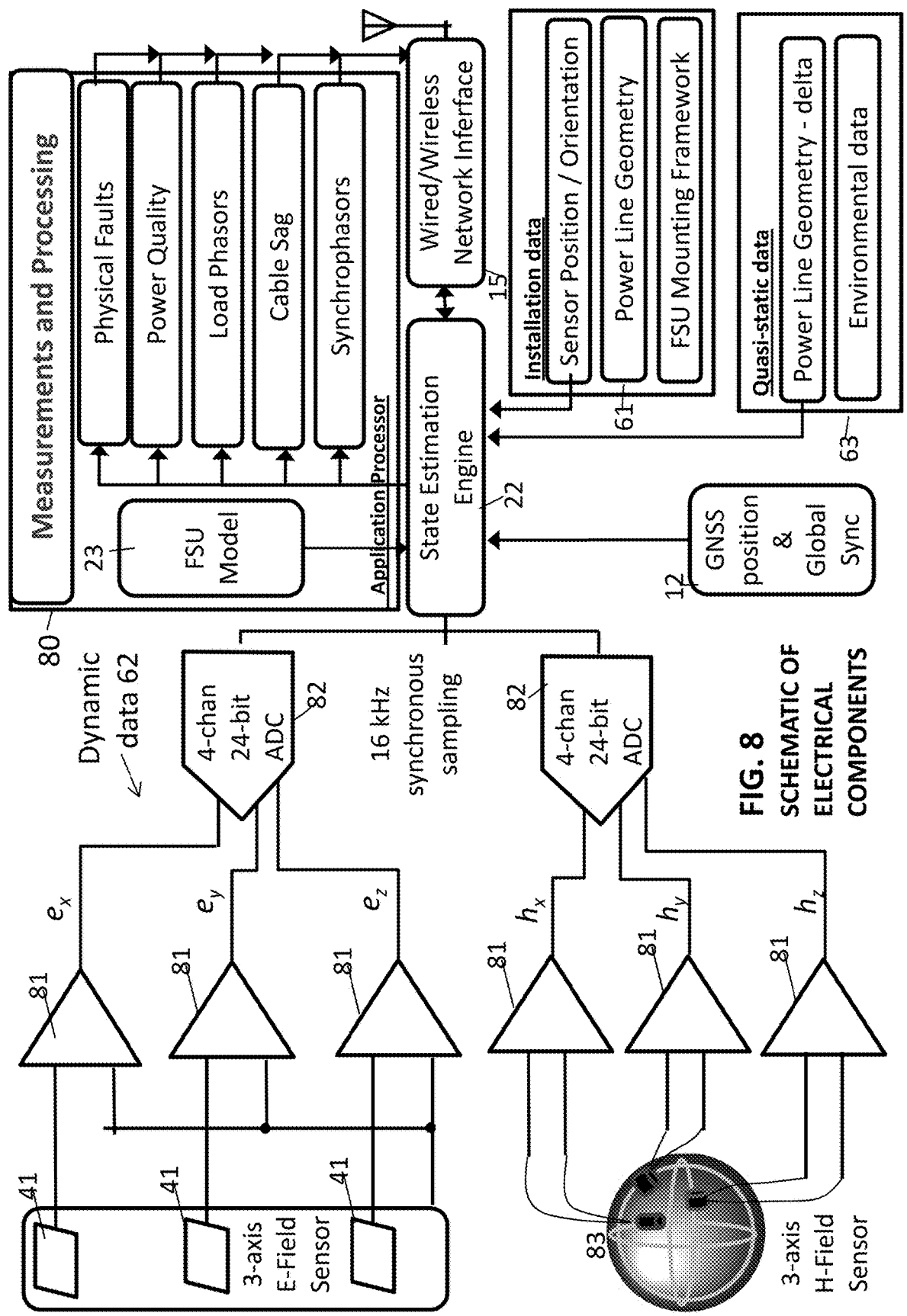
FIG. 8 is a schematic block diagram of the electrical components of a preferred embodiment of the present invention.

Referring now to FIG. 8, a schematic circuit diagram of a preferred embodiment of the present invention. Shown centrally in FIG. 8 are the state estimation engine or processor 22 and the field synchrophasor module or processor 23. Measurements and processing box 80 comprises Physical Faults, Power Quality, Load Phasors, Cable Sag and Synchrophasors, which are inputted into the wired and/or wireless network 15. In the leftmost portion of FIG. 8 electric field sensors 41 input into amplifiers 81 which output to 4-channel 24 bit analog to digital converters 82. Similarly, the magnetic data is inputted via a 3-axis H-field sensor 83 which inputs through amplifiers 81 to 4-channel 24-bit analog-to-digital converters 82. Both 4-channel 24-bit analog-to-digital converters 82 input into state estimation engine or processor 22. Installation data 61, described above with reference to FIG. 6, is inputted into the state estimation engine 22 along with the quasi-static data (both of which are referenced in regard to FIG. 6.

In the preceding specification, various embodiments have been described with reference to the accompanying drawings. It will, however, be evident that various modifications and changes may be made thereto, and additional embodiments may be implemented, without departing from the broader scope of the invention as set for in the claims that follow. The specification and drawings are accordingly to be regarded in an illustrative rather than restrictive sense.

As used herein, the terminology "synchrophasors" means synchronized phasor measurements that provide real-time measurement of electrical quantities from across a power system.

As used herein, a phasor measurement unit (PMU) or synchrophasor is a device which measures the electrical waves on an electricity grid, using a common time source for synchronization. Time synchronization allows synchronized real-time measurements of multiple remote measurement points on the grid. In power engineering, these are also commonly referred to as synchrophasors and are considered one of the most important measuring devices in the future of power systems. A PMU can be a dedicated device, or the PMU function can be incorporated into a protective relay or other device.

As used herein, in electricity, a phasor is defined as a complex number that represents both magnitude and phase angle of sine waves. "Synchrophasors" are phasor measurements that occur at the same time as the phasor management unit devices that allow their measurement. In general, phasor measurement units are sampled from widely dispersed locations in the power system network and synchronized using GPS systems or a GPS radio clock. Synchrophasor technology is used to measure the state of the electrical system and manage power quality.

As used herein, the terminology "processor" means computer, controller, CPU, microprocessor, or an integrated circuit that performs the functions of a computer.

As used herein, the terminology "proximate" means within a range of 300 meters (1000 ft). Generally, field sensors are placed within about ten meters of the power lines, or on the order of the distance between separate phase conductors.

As used herein, the terminology "power line" means a transmission or distribution line. Transmission lines are primarily used to transfer electrical energy from generating power plants over long distances at high voltages (typically 115 kV and greater) to electrical substations located near demand centers and electric power distribution. Distribution lines are primarily used to transfer electric power at lower voltages (typically 69 kV and below) from substations to industrial, commercial, and residential customers. Power lines are typically three-phase, but this invention is not limited to use with three-phase power lines. In the United States, power lines are typically operated at a nominal frequency of 60 Hz, but this invention is not limited to use with 60-Hz power lines. The combined transmission and distribution network is known as a "power grid".

As used herein, "model" means a 2-D or 3-D representation of at least one power line; an environment consisting of at least a ground plane, and possibly also additional lines, sag in the lines, power poles or support structures, trees, buildings, and any other objects that would distort the measured magnetic and/or electric fields, and any sources that would create additional quasi-static fields at power-line frequencies; at least one sensor at a location and orientation that may be known or that can be determined relative to the power line(s); and (optionally) known power system events that result in known voltage, current, or phase angle changes and that can be used to iteratively and dynamically adjust the initial (or "offline") model.

As used herein, "calibration matrix" means a set of coefficients that can be used to transform a set of at least one field measurement(s) into a set of estimated line voltage(s) and/or current(s). An initial calibration matrix can be determined in an "offline" calibration process using only a static model, as described above. An iterative or improved calibration matrix can be determined using a set of at least one measurement(s) and known (or "ground-truth") parameters.

Obviously, many modifications and variations of the present invention are possible in light of the above teachings. It is therefore to be understood that, within the scope of the appended claims, the invention many be practiced otherwise than as specifically described.

What is claimed is:

1. A system for measuring by estimating the magnitude and phase of at least one selected from the group consisting of electrical voltages and currents in at least one power line from electric field or magnetic field measurements comprising:
    at least one processor operating to create a model of the at least one power line and derive a set of expected complex electric or magnetic field values produced by the at least one power line based upon the model of the at least one power line;
    at least one memory operatively connected to the at least one sensor for storing a set of at least one selected from the group consisting of expected complex electric and magnetic values produced by the at least one power line based on the model of the at least one power line;
    at least one electric field sensor operatively connected to the at least one processor and positioned proximate to the at least one power line for sensing and providing measurements of the magnitude and phase of the electric fields produced by the at least one power line; and
    at least one magnetic field sensor operatively connected to the at least one processor and positioned proximate to the at least one power line for sensing and providing measurements of the magnitude and phase of the magnetic fields produced by the at least one power line;
    the at least one processor operating to:
        receive position and orientation measurement data for the at least one electric field sensor and the at least one magnetic field sensor with respect to individual conductors of the at least one power line;
        model, from the received position and orientation measurement data, a set of expected complex electric and magnetic field values produced by the at least one power line based on a model of the at least one power line by constructing a calibration matrix composed of geometric factors relating the voltages to the electric-field measurements or the currents to the magnetic-field measurements; and
        estimate the complex voltage and current for individual conductors of the at least one power line based on the measured set of complex field values and the set of expected field values using the constructed calibration matrix and vectors composed of the electric field or magnetic field measurements,
        whereby the status of the power line is monitored.

2. The system of claim 1 wherein the at least one electric field sensor comprises three electric field sensors positioned at different locations in proximity to the at least one power line which provide electric field measurements, and wherein the at least one processor computes three line voltages based upon the electric field measurements sensed by the plurality of electric field sensors, and wherein the at least one processor determines a relationship between the electric field measurements and power line voltages based upon a matrix equation:

$$\begin{bmatrix} E_1 \\ E_2 \\ E_3 \end{bmatrix} = \begin{bmatrix} K_{11} & K_{12} & K_{13} \\ K_{21} & K_{22} & K_{23} \\ K_{31} & K_{32} & K_{33} \end{bmatrix} \begin{bmatrix} V_A \\ V_B \\ V_C \end{bmatrix}$$

wherein $E_1$, $E_2$, $E_3$ represent the electric field sensed by the three electric field sensors, $V_A$, $V_B$, and $V_C$ are the voltages of three power lines and wherein the calibration matrix K, where $$K = \begin{bmatrix} K_{11} & K_{12} & K_{13} \\ K_{21} & K_{22} & K_{23} \\ K_{31} & K_{32} & K_{33} \end{bmatrix}$$

is the product of two real-valued matrices, C and S, where C is a capacitance matrix based upon self and mutual coupling between each of the at least one power line and the ground as a function of the diameter of the power line, height above ground, and relative positions, and where S is the source-to-field matrix which transforms the wire charges into the measured fields using Coulomb's Law and the Principle of Superposition.

3. The system of claim 1 wherein the at least one magnetic field sensor comprises a plurality of magnetic field sensors positioned at different locations in proximity to the at least one power line which provide magnetic field measurements, and wherein the at least one processor computes three line currents based upon the magnetic-field measurements sensed by the plurality of magnetic field sensors, and wherein the at least one processor determines a relationship between the magnetic field measurements and power line currents based upon a matrix equation H=PI, where H is the measured set of magnetic fields, P is the calibration matrix, and I is the line currents.

4. The system of claim 1 wherein the at least one electric field sensor outputs at least one electric field measurement and the at least one processor computes the power line voltage from the electric field measurement utilizing the calibration matrix, the at least one processor operating to create the calibration matrix by determining the source capacitance matrix C that represents the self- and mutual coupling between each of the wires and ground and source-sensor matrix S; multiplying the source capacitance matrix C and source-sensor matrix S together to obtain a calibration matrix K, where K=CS; and inverting the calibration matrix $K^{-1}$ to obtain the line voltage V where $V=K^{-1}E$.

5. The system of claim 4 wherein the at least one electric field or magnetic field measurement is inputted into a bandpass filter to obtain the field phasors corresponding to the operating frequency of the at least one power line, and wherein other phasors are used as a phase reference.

6. The system of claim 5 wherein the field phasors are rotated so that the phase angle of the line voltage V has a phase angle of zero.

7. The system of claim 4 wherein the calibration matrix is determined using an estimation process comprising one of least squares and method of moments.

8. The system of claim 1 wherein the at least one power line is supported by at least one support structures, and wherein at least one electric or magnetic field sensor is supported by the at least one support structure or the at least one power line.

9. The system of claim 1 further comprising a support structure for supporting the at least one power line and further comprising a synchronizer clock operatively connected to the at least one electric or magnetic field sensor for synchronizing the measurements to a time base; and wherein the at least one electric or magnetic field sensor is hung from the support structure.

10. The system of claim 1 wherein the at least one processor comprises a plurality of processors comprising a state estimation processor that operates to create the model of the at least one power line and a field synchrophasor processor.

11. The system of claim 10 wherein the state estimation processor operates using a non-linear estimation comprising an iterative Kalman filter to converge the at least one selected from the group consisting of measured electric and magnetic field measurements with the model of the at least one power line.

12. The system of claim 10 further comprising a field acquisition module and wherein the at least one electric or magnetic field sensor and the at least one field acquisition module are positioned in a housing which is placed proximate to the at least one power line for obtaining electric and/or magnetic field measurements produced by the at least one power line.

13. The system of claim 1 further comprising a global positioning module having an antenna for synchronizing the electric or magnetic field measurements to a global time base to compute a synchrophasor and further comprising a data communications component for communicating the system outputs.

14. The system of claim 1 wherein the at least one power line comprises at least one electrical power line in an electrical power grid and wherein the at least one electric or magnetic field sensor senses and provides measurements of the magnitude and phase of electric fields produced by the at least one power line; and wherein because of distortion of electric field measurements by the ground and steel support structures, a calibration matrix is used based at least in part on the positions of the power lines and the ground, and the positions and orientations of electric and magnetic field sensors.

15. A method of measuring the magnitude and phase of electrical currents and voltages in individual conductors of power lines from electric field or magnetic field measurements comprising:

measuring the magnitude and phase of the electric field produced by at least one power line with at least one electric field sensor positioned in the vicinity of the at least one power line;

measuring the magnitude and phase of the magnetic field produced by at least one power line with at least one magnetic field sensor positioned in the vicinity of the at least one power line;

receiving position and orientation measurement data for the at least one electric field sensor and the at least one magnetic field sensor with respect to individual conductors of the at least one power line;

synchronizing the electric field and magnetic field measurements to a global time base signal;

modeling, from the received position and orientation measurement data, a set of expected complex electric and magnetic field values produced by the at least one power line based on a model of the at least one power line by constructing a calibration matrix composed of geometric factors relating the voltages to the electric-field measurements or the currents to the magnetic-field measurements;

estimating the complex voltage and current for individual conductors of the at least one power line based on the measured set of complex field values and the set of expected field values using the constructed calibration matrix and vectors composed of the electric field or magnetic field time synchronized measurements.

16. The method of claim 15 wherein the at least one electric field sensor comprises a plurality of electric field sensors positioned at different locations in proximity to the at least one power line which provide electric field measurements, and wherein the at least one processor computes a line voltage based upon the electric field measurements sensed by the plurality of electric field sensors, and wherein the at least one processor determines a relationship between the electric field measurements and power line voltages based upon an estimation process $$\begin{bmatrix} E_1 \\ E_2 \\ E_3 \end{bmatrix} = \begin{bmatrix} K_{11} & K_{12} & K_{13} \\ K_{21} & K_{22} & K_{23} \\ K_{31} & K_{32} & K_{33} \end{bmatrix} \begin{bmatrix} V_A \\ V_B \\ V_C \end{bmatrix}$$

wherein $E_1$, $E_2$, $E_3$ represent the electric field sensed by the electric field sensors, $V_A$, $V_B$, and $V_C$ are the voltages of three power lines and wherein the calibration matrix K, where $$K = \begin{bmatrix} K_{11} & K_{12} & K_{13} \\ K_{21} & K_{22} & K_{23} \\ K_{31} & K_{32} & K_{33} \end{bmatrix}$$

is the product of two real-valued matrices, C and S where C is a capacitance matrix based upon coupling between each of the at least one power line and the ground as a function of the diameter of the power line, height above ground, and relative positions and S is the source-to-field matrix which transforms the wire charges into the measured fields using Coulomb's Law and the Principle of Superposition.

17. The method of claim 15 wherein the step of estimating the complex voltage of the at least one power line comprises determining a calibration matrix by:
   determining the source capacitance matrix C;
   determining the source-sensor matrix S;
   multiplying the source capacitance matrix and source sensor matrix together to obtain the calibration matrix K=CS; and
   inverting the calibration matrix $K^{-1}$;
   computing the complex voltage $V=K^{-1}E$, where E is the electric field measured.

18. A system for measuring by estimating the magnitude and phase of electrical currents and voltages in at least one electrical power line in a power grid from electric field or magnetic field measurements comprising;
   at least one processor operating to create a model of the at least one power line and derive a set of expected complex electric and magnetic field values produced by the at least one power line based upon the model of the at least one power line;
   at least one memory operatively connected to the at least one sensor for storing a set of expected complex electric and magnetic values produced by the at least one power line based on the model of the at least one power line;
   at least one electric field sensor operatively connected to the at least one processor and positioned proximate to the at least one power line for sensing and providing measurements of the magnitude and phase of the electric fields produced by the at least one power line; and
   at least one magnetic field sensor operatively connected to the at least one processor and positioned proximate to the at least one power line for sensing and providing measurements of the magnitude and phase of the magnetic fields produced by the at least one power line;
   a synchronizer operatively connected to the at least one electric field or magnetic field sensor which receives a signal from a clock for synchronizing the electric field and/or magnetic field sensor measurements in time;
   the at least one processor operating to:
      receive position and orientation measurement data for the at least one electric field sensor and the at least one magnetic field sensor with respect to individual conductors of the at least one power line;
      synchronize the electric field and magnetic field measurements to a global time base signal;
      model, from the received position and orientation measurement data, a set of expected complex electric and magnetic field values produced by the at least one power line based on a model of the at least one power line by constructing a calibration matrix composed of geometric factors relating the voltages to the electric-field measurements or the currents to the magnetic-field measurements; and
      estimate the complex voltage and current for individual conductors of the at least one power line based on the measured set of complex field values and the set of expected field values using the constructed calibration matrix and vectors composed of the electric field or magnetic field time synchronized measurements.

19. The system of claim 18 wherein the at least one electrical power line is supported by at least one support structure, each section of the at least one electrical power line between the at least one support structure comprising a span, and wherein at least one sensor is hung from the at least one electrical power line approximately mid-span or supported by the at least one support structure, and wherein the calibration matrix is used to alleviate distortion of the electric field measurements of the at least one sensor; the calibration matrix comprising values based on the positions of the power lines and the ground, and the positions and orientations of electric and magnetic field sensors.

20. The method of claim 15, further comprising: measuring the position and orientation of the electric field sensors and the magnetic field sensors with respect to individual conductors of the at least one power line.

21. The method of claim 15, wherein the model is a two dimensional (2D) model or a three dimensional (3D) model of individual conductors of the at least one power line.

22. The method of claim 15, wherein the at least one magnetic field sensor comprises a plurality of magnetic field sensors positioned at different locations in proximity to the at least one power line which provide magnetic field measurements, and
   wherein the at least one processor computes three line currents based upon the magnetic-field measurements sensed by the plurality of sensors, and wherein the at least one processor determines a relationship between the magnetic field measurements and power line currents based upon a matrix equation H=PI, where H is the measured set of magnetic fields, P is the calibration matrix, and I is the line currents.

23. The method of claim 15, further comprising:
   monitoring changes in electric field or magnetic field measurements; and
   updating the calibration matrix when changes to the electric field or magnetic field are detected.

24. The method of claim 15, wherein the at least one electric field or magnetic field sensor is positioned on the ground, on a pole supporting the power line or hanging on or below the power line.

25. The system of claim 18, wherein the at least one electric field sensor comprises a plurality of electric field sensors, and the at least one magnetic field sensor comprises a plurality of magnetic field sensors and the system further comprises:
- a common frame incorporating said plurality of sensors in a spaced apart manner which mounts horizontally or vertically with respect to the power lines; and
- a communication interface for wired or wireless communications of data from the plurality of sensors to the at least one processor.

26. The system of claim 18, further comprising:
- an amplifier connected to each of the electric field and magnetic field sensors;
- an analog-to-digital converter connected to each amplifier for converting the amplified electric field and magnetic field sensor analog measurements to a digital signal representations thereof; and
- a state estimation engine receiving the digital signals and operating to compute a field synchrophasor using the constructed calibration matrix.

27. The method of claim 21, wherein the 2D or 3D model further comprises: at least a ground plane, any additional lines, sag in the lines, power poles or support structures, trees, buildings, or any other objects that would distort the measured electric and/or magnetic fields or create additional quasi-static fields at power-line frequencies, or any combination thereof.

* * * * *